United States Patent
Gill

(10) Patent No.: US 7,372,674 B2
(45) Date of Patent: May 13, 2008

(54) MAGNETIC TUNNEL TRANSISTOR WITH HIGH MAGNETOCURRENT AND STRONGER PINNING

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 472 days.

(21) Appl. No.: 11/187,665

(22) Filed: Jul. 22, 2005

(65) Prior Publication Data

US 2007/0019339 A1   Jan. 25, 2007

(51) Int. Cl.
G11B 5/39 (2006.01)
(52) U.S. Cl. .................................... 360/324.2
(58) Field of Classification Search ............. 360/324.2; 257/295
See application file for complete search history.

(56) References Cited

U.S. PATENT DOCUMENTS

| | | | | |
|---|---|---|---|---|
| 4,700,211 | A | 10/1987 | Popovic et al. | 357/27 |
| 6,611,405 | B1 | 8/2003 | Inomata et al. | 360/324.2 |
| 6,751,074 | B2 | 6/2004 | Inomata et al. | 360/324.2 |
| 6,818,458 | B1* | 11/2004 | Gill | 438/3 |
| 6,833,598 | B2 | 12/2004 | Sato et al. | 257/421 |
| 7,001,680 | B2* | 2/2006 | Gill | 428/811.1 |
| 7,230,804 | B2* | 6/2007 | Gill | 360/324.2 |
| 7,276,384 | B2* | 10/2007 | Parkin et al. | 438/3 |
| 2003/0197984 | A1 | 10/2003 | Inomata et al. | 361/324.2 |
| 2004/0175596 | A1 | 9/2004 | Inomata et al. | 428/693 |
| 2005/0025999 | A1 | 2/2005 | Gill | 428/694 TM |
| 2005/0226043 | A1* | 10/2005 | Parkin et al. | 365/173 |
| 2005/0282379 | A1* | 12/2005 | Saito et al. | 438/624 |
| 2006/0033145 | A1* | 2/2006 | Kakoschke et al. | 257/315 |
| 2006/0043443 | A1* | 3/2006 | Sugahara et al. | 257/295 |
| 2006/0118839 | A1* | 6/2006 | Sugahara et al. | 257/295 |

OTHER PUBLICATIONS

Sebastiaan van Dijken, Xin Jiang and Stuart S.P. Parkin, "Giant Magnetocurrent Exceeding 3400% in Magnetic Tunnel Transistors With Spin-valve Base Layers," Applied Physics Letters, vol. 83, No. 5, Aug. 4, 2003.

* cited by examiner

*Primary Examiner*—Jefferson Evans
(74) *Attorney, Agent, or Firm*—Zilka-Kotab, PC

(57) ABSTRACT

A magnetic tunnel transistor (MTT) having a pinned layer that is extended in a stripe height direction and is exchange coupled with an antiferromagnetic (AFM) layer in the extended portion outside of the active area of the sensor. Exchange coupling only the extended portion of the pinned layer with the AFM results in strong, robust pinning of the pinned layer while eliminating the AFM layer from the active portion of the sensor. The presence of an AFM layer within the active area of the sensor would result in an extreme loss of hot electrons resulting in a prohibitively large loss of performance. Therefore, eliminating the AFM layer from the active area provides a very large performance enhancement while maintaining robust pinning.

29 Claims, 5 Drawing Sheets

MAGNETIC TUNNEL TRANSISTOR WITH HIGH MAGNETOCURRENT AND STRONGER PINNING

FIELD OF THE INVENTION

The present invention relates to magnetic tunnel transistors and more particularly to a magnetic tunnel transistor having a pinned layer structure formed directly on a GaAs base, resulting in improved pinned layer pinning and increased magnetocurrent.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The push for ever increased data rate and data capacity has lead a drive to increase the performance and decrease the size of magnetoresistive sensors. Such efforts have lead to an investigation into the development of tunnel junction sensor or tunnel valves. A tunnel valve operates based on the quantum mechanical tunneling of electrons through a thin electrically insulating barrier layer. A tunnel valve includes first and second magnetic layers separated by a thin, non-magnetic barrier. The probability of electrons passing through the barrier layer depends upon the relative orientations of the magnetic moment of the first and second magnetic layers. When the moments are parallel, the probability of electrons passing through the barrier is at a maximum, and when the moments are antiparallel, the probability of electrons passing through the barrier is at a minimum.

To further increase the signal output generated as a result of reading a given magnetic signal, some researchers have investigated the possibility of incorporating tunnel junction sensor technology into a transistor device (tunnel transistor). To date, however, no practical tunnel transistors have been developed. The failure of such devices has been in large part to the inability to satisfy the needs of a tunnel valve (such as strong pinned layer pinning) while also meeting the needs of a transistor device (such as the selection of appropriate emitter, base and collector materials).

Therefore, there is a need for a magnetoresistive device that can greatly increase magnetoresistive output from a given magnetic signal. Such a device would preferably incorporate the magnetoresistive advantages of tunnel junction sensors with the large gain advantages of transistor devices.

SUMMARY OF THE INVENTION

The present invention provides a magnetic tunnel transistor (MTT) having improved performance and robust performance. An MTT according to the present invention includes an emitter, base and collector. The base includes a free layer, pinned layer and a non-magnetic spacer sandwiched the free and pinned layer. The emitter and base are separated by a thin, electrically insulating barrier layer. The magnetic tunnel transistor has stripe height that is measured from the ABS to the edge of the free layer furthest from the ABS. The pinned layer extends significantly beyond this stripe height and is exchange coupled to a layer of antiferromagnetic material (AFM) layer in this region outside of the active area of the sensor.

Having an AFM layer in the active region of the sensor significantly degrades performance by scattering electrons and greatly reducing the number of hot electrons passing through the barrier transistor. However, strong pinned layer pinning is needed to maintain robustness.

By exchange coupling the pinned layer with the AFM layer outside of the active area, the pinned layer can be constructed directly upon a semiconductor substrate such as a GaAs substrate resulting in very large transistor gain. The AFM layer can be constructed of an electrically insulating AFM material such as alpha phase iron oxide to avoid shunting sense current through the AMF layer. Alternatively, the AFM layer can be formed of an electrically conductive AFM material such as PtMn or IrMn, in which case thin insulation layers can be formed between the AFM layer and adjacent non-pinned layer portions of the MTT and also between the AFM and the adjacent shield.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
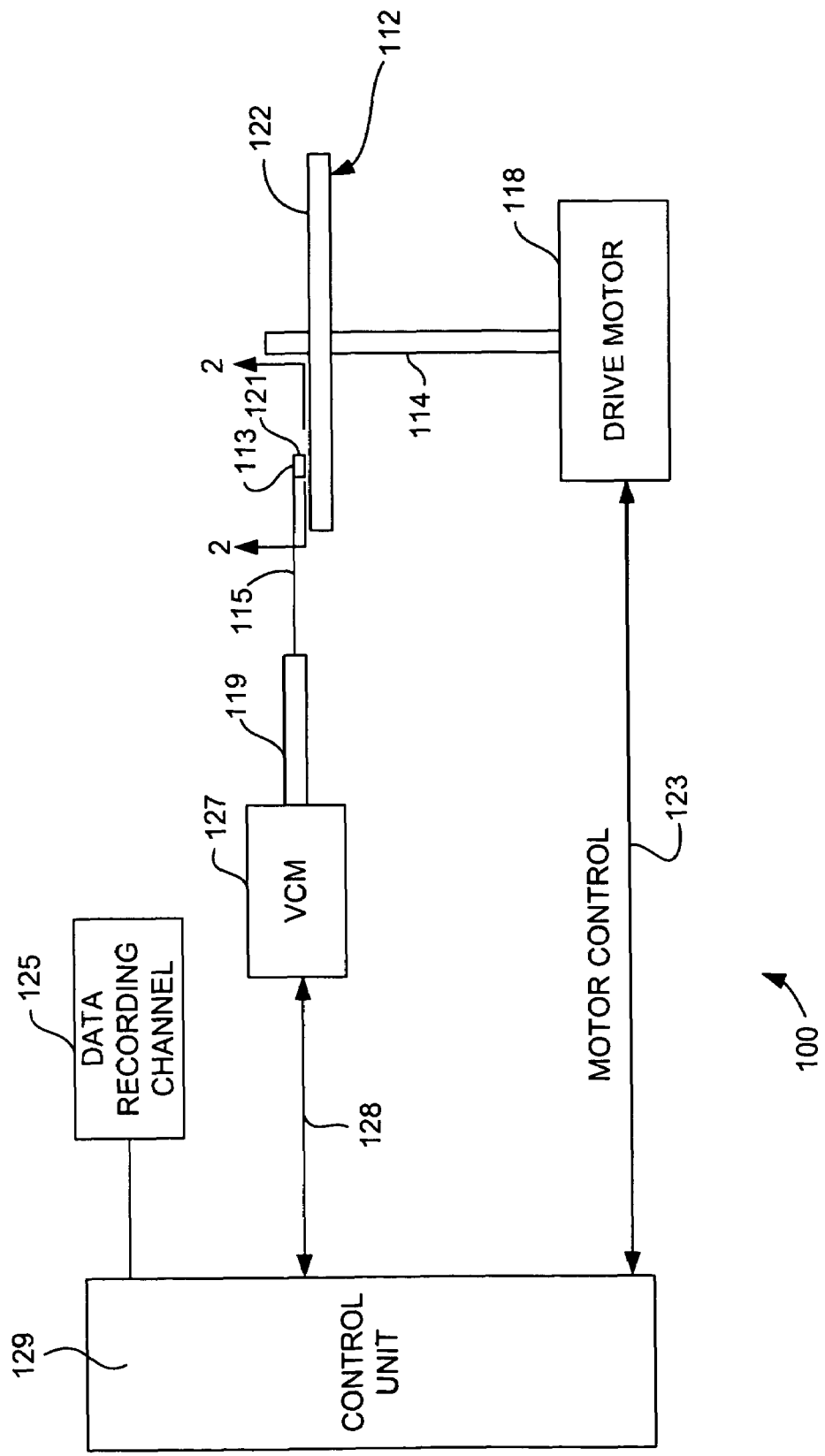
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
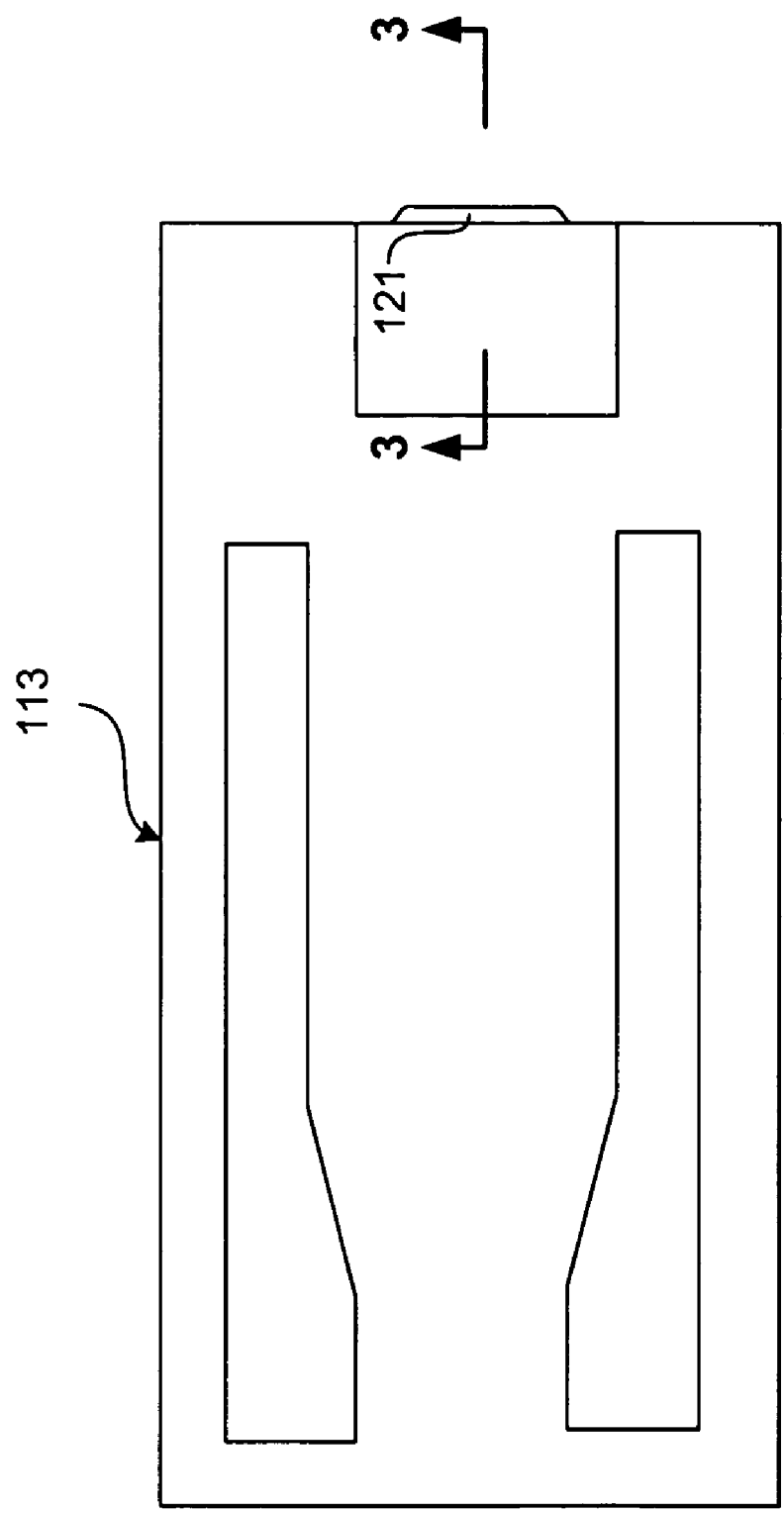
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
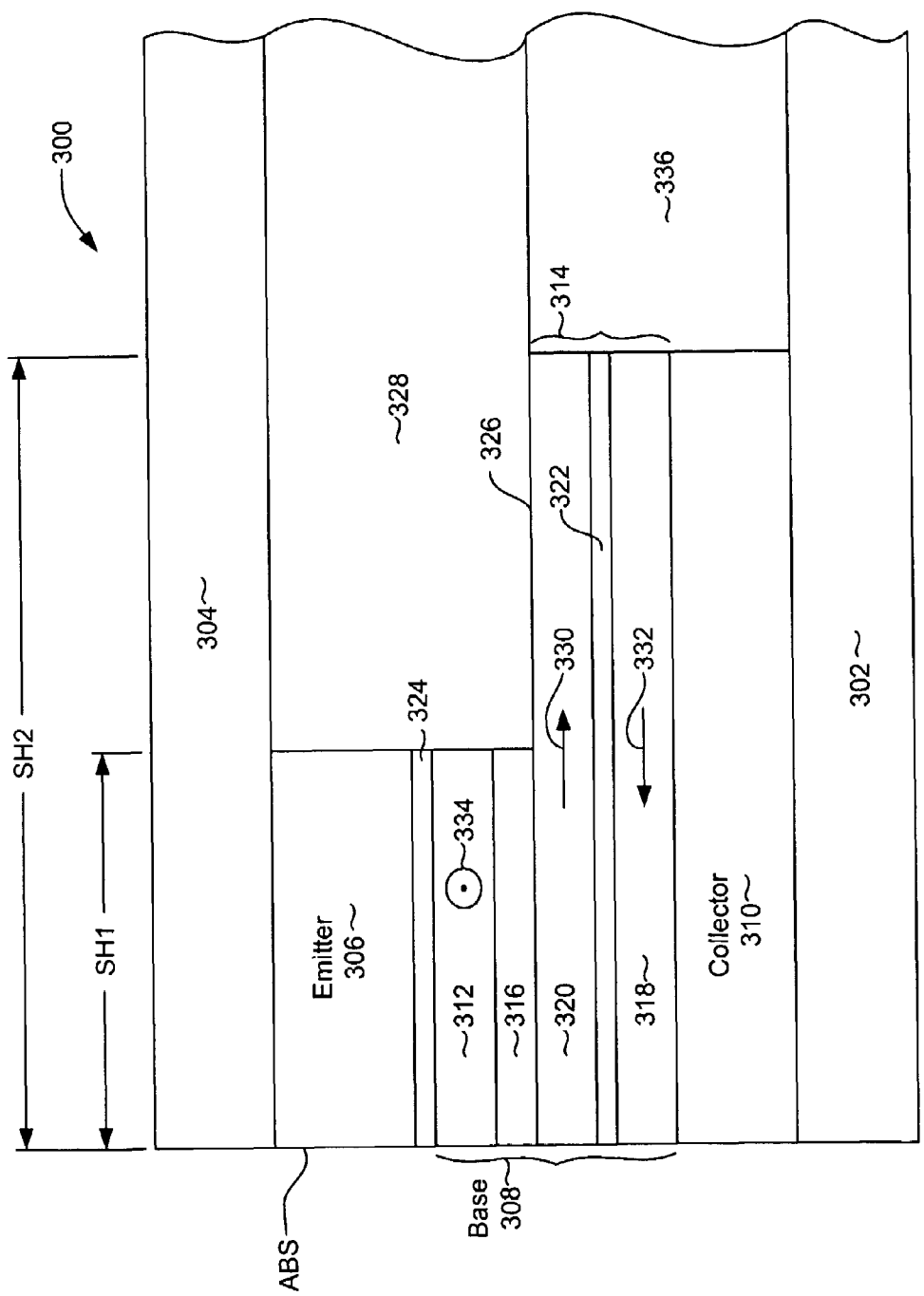
FIG. 3; is a cross sectional view, taken from line 3-3 of FIG. 2 illustrating a magnetic tunnel transistor according to an embodiment of the invention.

With reference now to FIG. 3, a possible embodiment of the invention includes a tunnel transistor device 300 sandwiched between first and second leads 302, 304. The leads 302, 304 can be constructed of a magnetic material such as NiFe so that they may function as magnetic shields as well as electrical leads. The tunnel transistor device 300 includes an emitter portion 306, a base portion 308 and a collector portion 310. Although it can be seen that the collector 310 is electrically connected with first lead 302, and the emitter 304 is electrically connected with the second lead 304, the base is actually connected with a third lead that is not shown in FIG. 3 and preferably extends along a direction out of the page in FIG. 3.

The collector 310 is preferably a GaAs layer having a (001) orientation. As those skilled in the art will appreciate, this is one of the cubic lattice planes. Cubic structures have three axes, for example x, y, z. A (001) orientation is along a plane that is parallel to the x, y planes and cuts the z axis. The collector 310 preferably has a thickness of 100-500 Angstroms and can be deposited on the shield 302 by sputtering.

The base 308 is a giant magnetoresistive (GMR) element having a magnetic free layer 312, a pinned layer structure 314 and a non-magnetic, electrically conductive spacer layer 316 sandwiched between the free layer 312 and pinned layer structure 314. The free layer 312 can be constructed of Co, CoFe, NiFe or a combination of these layers, and can have a thickness of about 20-60 Angstroms. Spacer layer 316 can be constructed of, for example Cu and can have a thickness of 20-40 Angstroms. The pinned layer structure 314 can several configurations and is preferably an antiparallel coupled (AP coupled) structure having a first magnetic layer (AP1) 318 a second magnetic layer (AP2) 320 and a non-magnetic, electrically conductive AP coupling layer 322 sandwiched between the AP1 and AP2 layers 318, 320. The AP1 and AP2 layers 318, 320 can be constructed of many magnetic materials, and are preferably constructed of CoFe, each having a thickness 20-40 Angstroms. The AP1 and AP2 layers are more preferably $Co_{70}Fe_{30}$, $Co_{50}Fe_{50}$ or a CoFe alloy having 70-50 atomic percent Co. CoFe has the advantageous properties of providing excellent magnetic GMR performance, and also providing a strong positive magnetostriction, which when combined with compressive stresses in the sensor 300 cause the AP1 and AP2 layers to a desired, strong magnetic anisotropy in a direction perpendicular to the ABS. The AP coupling layer 322 can be constructed of, for example, Ru and can have a thickness of 4-8 Angstroms, to provide strong antiparallel coupling between the AP1 and AP2 layers 318, 320.

The emitter 306 can be constructed of, for example Cu or Al and can have a thickness of 20-40 nm or about 30 nm. The emitter is separated from the base by a tunnel barrier layer 324. The barrier layer 324 can be constructed of several materials including aluminum oxide ($Al_2O_3$), magnesium oxide ($MgO_x$) or titanium oxide ($TiO_x$). The barrier layer 324 preferably has a thickness of 10-30 Angstroms.

With continued reference to FIG. 3, it can be seen that the magnetic tunnel transistor (MTT) 300 does not include an antiferromagnetic layer (AFM layer) in the active area of the sensor (ie between the pinned layer 314 and the GsAs collector 310) for pinning the magnetic moment of the pinned layer 314. A problem experienced with prior art MTT sensors is that the use of an AFM layer for pinning the pinned layer renders such a MTT with a spin valve base essentially useless. This is due to the loss of hot electrons caused by electron scattering in the AFM layer. Removal of the AFM layer from the active area of the MTT sensor 300 results in a very large increase in magnetocurrent (MC), the resulting increase being several thousand percent over a MTT having an AFM layer.

In order to eliminate the AFM layer and still maintain pinning, it is necessary to replace the AFM with another suitable pinning mechanism. With reference still to FIG. 3, it can be seen that the sensor 300 has a first stripe height SH1 as measured from the air bearing surface (ABS). The ABS is located at the surface of the sensor that is closest to the magnetic medium (not shown). Although referred to as an air bearing surface, this ABS surface could also be referred to as a medium facing surface, because, as fly heights become ever smaller, the slider could at some point be considered to be in contact with the medium. This first stripe height is defined by the free layer 312 and preferably other layers such as the emitter 306 barrier 324 and spacer 316. The It can also be seen that the pinned layer 314 extends significantly beyond the first stripe height SH1 to a second stripe height SH2 that is significantly larger than the first stripe height SH1. This extended pinned layer 314 creates a strong shape induced anisotropy in a direction perpendicular to the ABS. This magnetic anisotropy is additive to other pinning mechanisms, including a magnetostriction induced anisotropy and antiparallel coupling. As discussed above, the magnetostriction induced anisotropy is the result of the strong positive magnetostriction of the pinned layers 318, 320, in combination with compressive stresses in the sensor. In order to ensure effective pinned layer pinning, the stripe, height SH2 of the pinned layer is preferably about 2 times the stripe height SH1 of the free layer and other layers.

With continued reference to FIG. 3, the pinned layer structure 314 has an extended portion that is outside of the active area of the sensor. That is to say it extends between from the first stripe height SH1 to the second stripe height SH2, and is beyond the end of the free layer 312, spacer 316, barrier 324 and emitter 306. The active area is within SH1 and is defined by the stripe height of the free layer 312. This extended portion 326 can be exchange coupled with an antiferromagnetic layer (AFM layer) 328. This AFM layer is preferably an electrically insulating antiferromagnetic material layer such as Alpha phase iron oxide ($Fe_2O_3$) or some other electrically insulating antiferromagnetic material layer. Making the AFM layer 328 of an electrically insulating material prevent sense current from being shunted between the leads 304, 302 outside of the active area of the sensor. Alternatively, the AFM layer could be constructed of an electrically conductive material such as PtMn, or IrMn. However, in that case, an electrically insulating layer of, for example, alumina would be needed at the back stripe height edge of the spacer 316, free layer 312, barrier 324, and emitter 306. The insulation would also have to extend between the AFM 328 and the adjacent lead 304. Such an insulation layer will be described in greater detail below with reference to FIG. 4.

The AFM layer 328 is exchange coupled with the extended portion of the pinned layer structure 314 and more specifically is exchange coupled with the AP2 layer 320. This exchange coupling strongly pins the magnetic moment 330 of the extended portion of the AP2 layer in a direction perpendicular to the ABS. This in turn pins the entire AP2 layer 320. The AP coupling between the AP1 and AP2 layers 318, 320 pins the moment 332 of the AP layer 318 in a direction opposite to that 330 of AP2 320. The AP coupling of the two layers 318, 320, magnetostatically induced anisotropy, and shape induced anisotropy (as a result of the extended stripe height SH2 of the pinned layer) further increase the pinning of the moments 330, 332. The free layer 312 has a magnetic moment 334 that is biased in a direction parallel with the ABS as indicated, but which is free to rotate in response to a magnetic field from an adjacent magnetic medium. Biasing of the free layer, can be provided by hard bias layers (not shown), which would be into and out of the plane FIG. 3. The remaining space between the shields 302, 304 (that behind the pinned layer 314 and collector 310) can be filled with an electrically insulating, non-magnetic fill layer 336.

Figure 4:
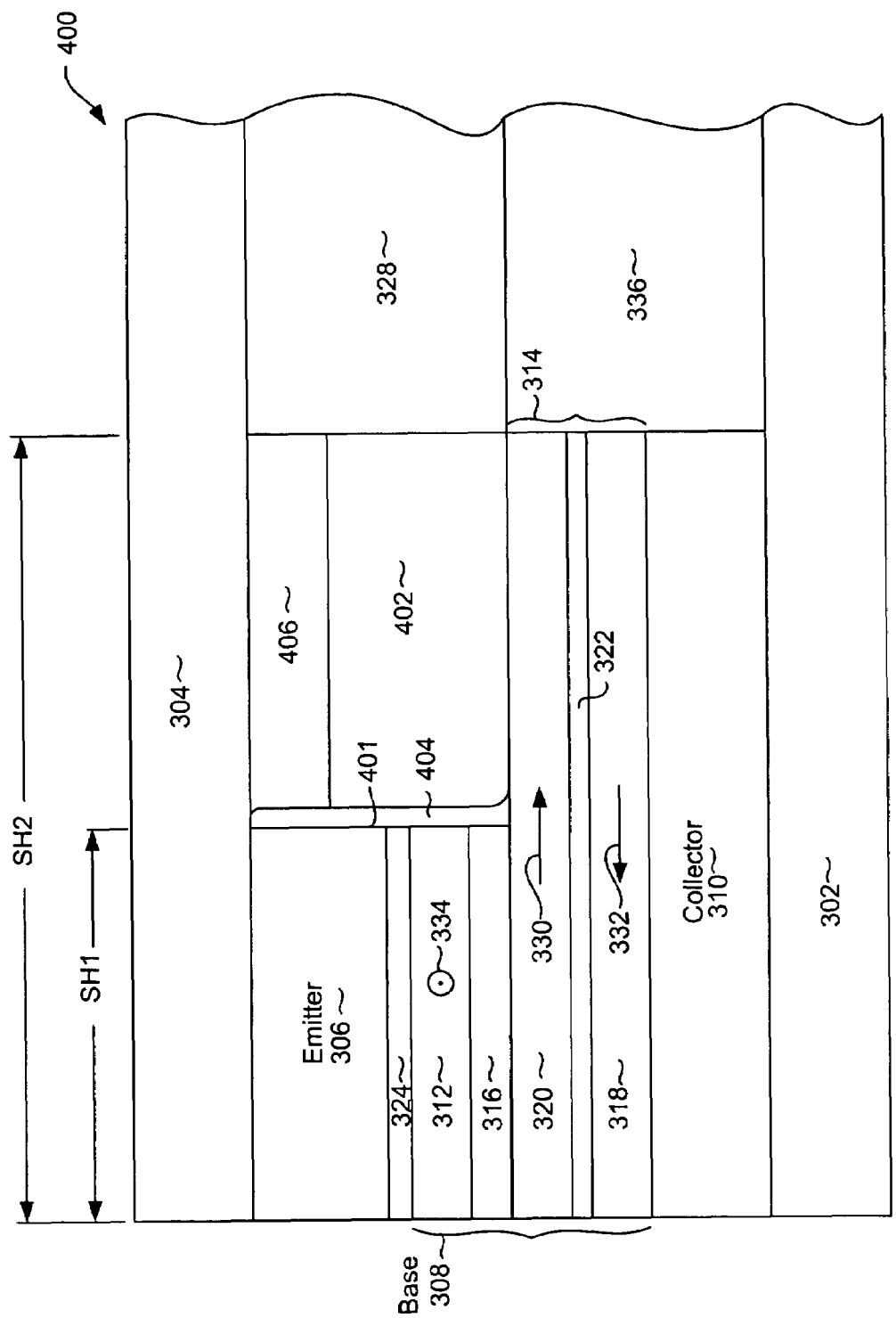
FIG. 4 is a cross sectional view of an alternate embodiment of the invention.

With reference now to FIG. 4, a MTT 400 according to another embodiment of the invention has a structure similar to that described above with reference to FIG. 3, except that it provides the option of using an electrically conductive AFM layer 402 such as PtMn, or IrMn. The sensor 400 includes a stripe height insulation layer 404 formed at the stripe height edge 401 located at SH1. The stripe height insulation layer is located between the AFM layer 402 and the spacer 316, free layer 312, barrier 324 and emitter 306. This insulation layer can be constructed of, for example tantalum oxide (TaO$_x$), and can be deposited, for example by a conformal deposition process such as chemical vapor deposition (CVD) atomic layer deposition (ALD) or some other deposition technique. This deposition will deposit the insulation material to a substantially uniform thickness across the top of the emitter 306, down across the first stripe height edge 401 of the sensor, and across the top of the pinned layer 314. A directionally preferential material removal process such as reactive etch (RIE) to remove horizontally disposed portions of the insulation layer. This will leave only the vertically disposed portion of the insulation layer 404 formed on the first stripe height edge 401 of the sensor 400. Thereafter, the AFM layer 402 can be deposited, and a top insulation layer 406, such as alumina, can be deposited over the top of the AFM layer 402 to insulate the AFM layer 402 from the top shield 404.

Figure 5:
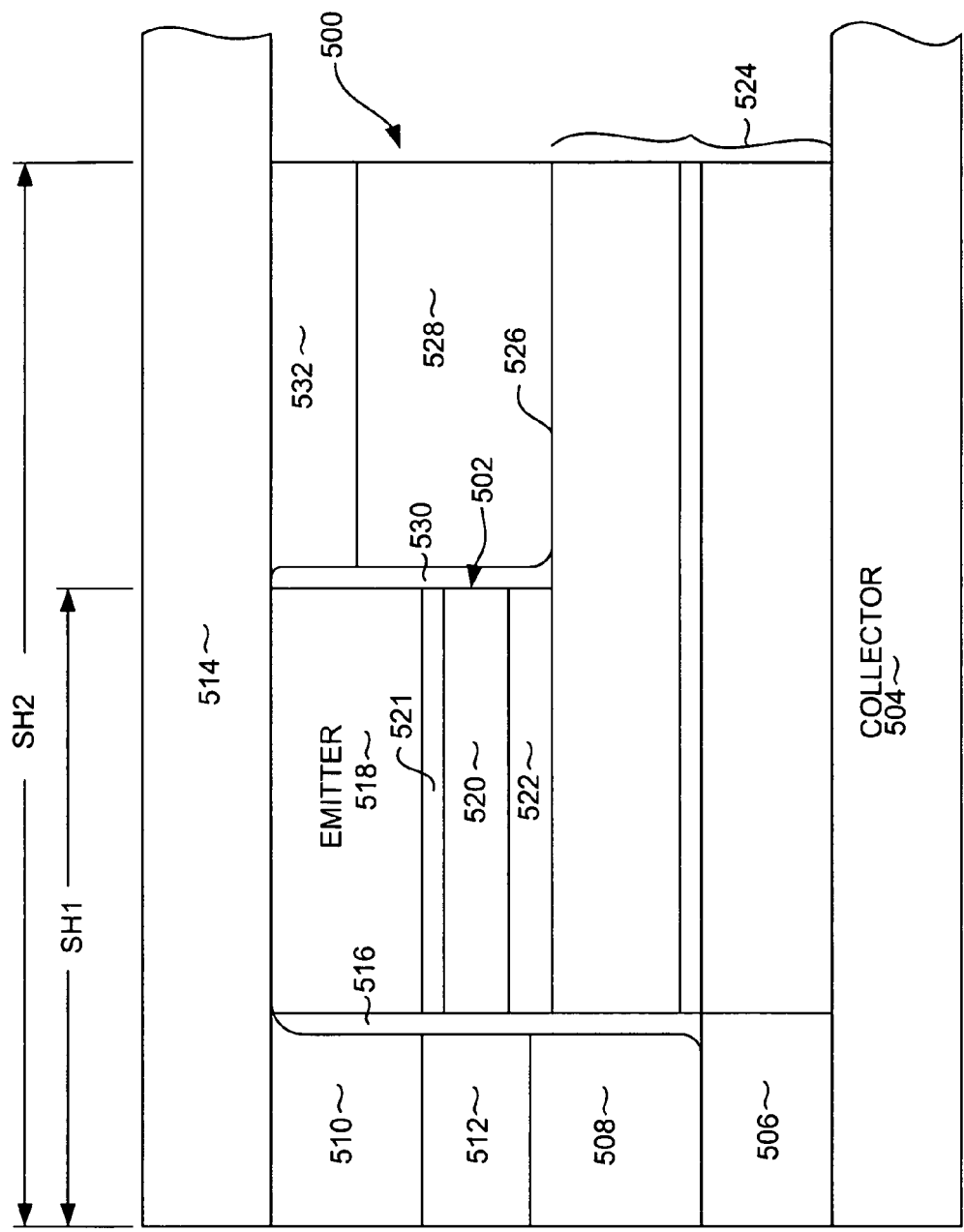
FIG. 5 is a cross sectional view of yet another embodiment of the invention.

With reference now to FIG. 5, in another embodiment of the invention 500, includes a MTT sensor stack 502 that is recessed from the ABS. The sensor stack 502 is constructed upon a semi-conductor substrate 504, such as a GaAs substrate. The semi-conductor substrate 504 is a collector, and may be referred to herein as a collector 504. The sensor stack is separated from the ABS by first shield 506, first and second insulation layers 508, 510 and a magnetic flux guide 512. A second shield 514 is formed above the sensor stack 502. The first and second insulation layers can be constructed of, for example, alumina Al$_2$O$_3$ or some other electrically insulating material. A thin third insulation layer 516, such as alumina, is disposed between the flux guide 512 and the sensor stack 502. As with the previously described embodiments, the sensor 500 includes an emitter 518, a base that is made up of a magnetic free layer 520 and a non-magnetic, electrically conductive spacer layer 522, and a pinned layer 524. A thin, electrically insulating barrier layer 521 is sandwiched between the free layer 520 and the emitter 518.

The pinned layer 524 is constructed directly upon the GaAs substrate (collector) 504, and has an extended portion 526 that is exchange coupled with an AFM layer 528. The AFM layer 328 may be an electrically conductive AFM material such as Alpha phase Fe$_2$O$_3$, or may be an electrically conductive AFM material such as PtMn, or IrMn, in which case an insulation layer 530 would be formed in front of the AFM layer, and an insulation layer 532 would be formed above the AFM layer 528 to prevent shunting of current through the AFM layer 528.

As can be seen, the embodiment described above with reference to FIG. 5 allows the pinned layer 524 to be formed directly on top of a thick GaAs substrate 504. As with the previously described embodiments, the shields 506, 514 are constructed of electrically conductive material and function as electrical leads. The presently described embodiment advantageously allows the first shield/lead 506 to be in direct contact with the pinned layer 514, while also allowing the pinned layer 514 to be constructed directly on top of the collector 504. Constructing the pinned layer 514 directly on top of the collector 504 provides optimal MTT performance. Therefore, this contact between the pinned layer 524 and collector 504 can be maintained while virtually eliminating parasitic resistance through the collector 504.

Although magnetic tunnel transistors discussed above have been described with reference to use in a magnetic memory device such as a disk drive, a magnetic tunnel transistor according to the present invention could also be used in a magnetic random access memory (MRAM). By way of example, a MRAM device can include a series of essentially parallel bit lines and a series of word lines that are parallel with one another and perpendicular to the bit lines. The word lines and bit lines do not actually intersect, but appear to form a grid when viewed from above. Each word line is connected to each bit line by a magnetic tunnel transistor.

Current flowing through a word and bit line generates a magnetic field that affects the magnetic tunnel junction transistor associated with that pair of word and bit lines, thereby allowing the magnetic state of the magnetic transistor to be switched. The magnetic state of a particular memory cell (magnetic tunnel transistor) defines a memory state (off or on).

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic tunnel transistor (MTT) having an air bearing surface (ABS), comprising:
    an emitter;
    a collector;
    a base sandwiched between the emitter and collector, the base comprising a magnetic free layer, a magnetic pinned layer and a non-magnetic spacer layer sandwiched between the free layer and the pinned layer, the free layer having a dimension measured from the ABS to define a stripe height, and the pinned layer having a portion extending beyond the stripe height defined by the free layer; and
    a layer of antiferromagnetic material contacting the extended portion of the pinned layer.

2. A magnetic tunnel transistor as in claim 1 wherein the collector contacts the pinned layer on a first side of the pinned layer and the layer of antiferromagnetic material contacts the pinned layer on a second side of the pinned layer opposite the first side of the pinned layer.

3. A magnetic tunnel transistor as in claim 1 wherein the transistor has an active region disposed between the ABS and the stripe height and wherein the AFM layer is disposed entirely outside of the active region.

4. A magnetic tunnel transistor as in claim 1 wherein the layer of antiferromagnetic material comprises an electrically insulating antiferromagnetic material.

5. A magnetic tunnel transistor as in claim 1 wherein the layer of antiferromagnetic material comprises Fe$_2$O$_3$.

6. A magnetic tunnel transistor as in claim 1 wherein the layer of antiferromagnetic material comprises Alpha phase Fe$_2$O$_3$.

7. A magnetic tunnel transistor as in claim 1 wherein the collector comprises GaAs.

8. A magnetic tunnel transistor as in claim 1 wherein the collector comprises GaAs having a (001) crystal structure.

9. A magnetic tunnel transistor as in claim 1 further comprising a layer of electrically insulating material disposed between the layer of antiferromagnetic material and the free layer.

10. A magnetic tunnel transistor as in claim 1, wherein the emitter, barrier and free layer define a stripe height edge located at the stripe height and wherein the magnetic tunnel transistor further comprises an insulation layer disposed between the layer of antiferromagnetic material and the stripe height edge.

11. A magnetic tunnel transistor as in claim 1 further comprising:
   a magnetic, electrically conductive shield, electrically connected with the emitter;
   a first insulation layer separating the layer of antiferromagnetic material from the emitter, barrier and free layer; and
   a second insulation layer separating the layer of antiferromagnetic material from the shield.

12. A magnetic tunnel transistor as in claim 1 further comprising:
   a first magnetic, electrically conductive shield;
   a second magnetic, electrically conductive shield, the emitter, base and collector being sandwiched between the first and second shields;
   a first layer of electrically insulating material separating the layer of antiferromagnetic material from the emitter, barrier and free layer; and
   a second layer of electrically insulating material separating the layer of electrically insulating material from the second shield.

13. A magnetic tunnel transistor as in claim 12 wherein the first electrically insulating layer comprises tantalum oxide and the second electrically insulating layer comprises aluminum oxide.

14. A magnetic tunnel transistor as in claim 1 wherein the emitter and base are recessed from the ABS, the magnetic tunnel transistor further comprising:
   first and second electrically insulating layers formed adjacent to the ABS;
   a magnetic flux guide disposed between the ABS and the free layer and sandwiched between the first and second electrically insulating layers.

15. A magnetic tunnel transistor as in claim 1 wherein the emitter and base are recessed from the ABS, the magnetic tunnel transistor further comprising:
   first and second electrically insulating layers formed adjacent to the ABS;
   a magnetic flux guide disposed between the ABS and the free layer and sandwiched between the first and second electrically insulating layers; and
   a third electrically insulating layer separating the flux guide from the free layer.

16. A magnetic tunnel transistor as in claim 1 wherein the emitter and the base are recessed from the ABS and the collector extends substantially to the ABS, the magnetic tunnel transistor further comprising:
   a magnetic flux guide sandwiched between first and second non-magnetic, electrically insulating layers, the first and second non-magnetic electrically insulating layer and the flux guide being located between the ABS and the emitter and base;
   a third electrically insulating layer separating the flux guide from the emitter and base; and
   an electrically conductive, magnetic shield formed between the first electrically insulating layer and the collector and between the ABS and the pinned layer.

17. A magnetic tunnel transistor as in claim 1 wherein the emitter and the base are recessed from the ABS and the collector extends substantially to the ABS, the magnetic tunnel transistor further comprising:
   a magnetic flux guide sandwiched between first and second non-magnetic, electrically insulating layers, the first and second non-magnetic electrically insulating layer and the flux guide being located between the ABS and the emitter and base, the first and second electrically insulating layers comprising aluminum oxide;
   a third electrically insulating layer comprising tantalum oxide separating the flux guide from the emitter and base; and
   an electrically conductive, magnetic shield formed between the first electrically insulating layer and the collector and between the ABS and the pinned layer.

18. A magnetic data storage system, comprising:
   a housing;
   a magnetic disk rotatably mounted with in the housing;
   an actuator;
   a slider connected with the actuator for movement adjacent to a surface of the magnetic disk; and
   a magnetic tunnel transistor connected with the slider, the magnetic tunnel transistor comprising:
   an emitter;
   a collector;
   a base sandwiched between the emitter and collector, the base comprising a magnetic free layer, a magnetic pinned layer and a non-magnetic spacer layer sandwiched between the free layer and the pinned layer, the free having a dimension measured from the ABS to define a stripe height, and the pinned layer having a portion extending beyond the stripe height defined by the free layer; and
   a layer of antiferromagnetic material contacting the extended portion of the pinned layer.

19. A suspension assembly, comprising:
   a suspension arm;
   a slider connected with the suspension arm; and
   a magnetic tunnel transistor connected with the slider, the magnetic tunnel transistor comprising:
   an emitter;
   a collector;
   a base sandwiched between the emitter and collector, the base comprising a magnetic free layer, a magnetic pinned layer and a non-magnetic spacer layer sandwiched between the free layer and the pinned layer, the free having a dimension measured from the ABS to define a stripe height, and the pinned layer having a portion extending beyond the stripe height defined by the free layer; and
   a layer of antiferromagnetic material contacting the extended portion of the pinned layer.

20. A magnetic tunnel transistor (MTT) having an air bearing surface, the MTT comprising:
   an emitter;
   a collector;
   a base located between the emitter and collector the base comprising a magnetic free layer and a magnetic pinned layer, the free layer extending from the ABS to a first strip height location, and the pinned layer extending from the ABS to a second stripe height location, the distance between the ABS and the first stripe height location defining an active area, and the distance between the first stripe height location and the second stripe height location defining an inactive area; and
   a layer of antiferromagnetic material exchange coupled with the pinned layer in the inactive area.

21. A MTT sensor as in claim 20 wherein the layer of antiferromagnetic material comprises a material that is electrically insulating.

22. A MTT sensor as in claim 20 wherein the layer of antiferromagnetic material comprises $Fe_2O_3$.

23. A MTT sensor as in claim 20 wherein the layer of antiferromagnetic material comprises an electrically conductive material, the MTT sensor further comprising a layer of electrically insulating material separating the layer of antiferromagnetic material from the free layer.

24. A MTT sensor as in claim 20 wherein the layer of antiferromagnetic material comprises an electrically conductive material, the MTT sensor further comprising a layer of electrically insulating material separating the layer of antiferromagnetic material from the free layer and the emitter.

25. A MTT sensor as in claim 20 further comprising a non-magnetic, electrically insulating barrier layer sandwiched between the emitter and the base.

26. A MTT sensor as in claim 20 further comprising a non-magnetic, electrically conductive spacer layer sandwiched between the free layer and the pinned layer.

27. A MTT sensor as in claim 20 wherein the collector comprises GaAs.

28. A MTT sensor as in claim 20 wherein the collector comprises GaAs having a (001) structure.

29. A MTT sensor as in claim 20 wherein the collector contacts the pinned layer on a first side of the pinned layer and the layer of antiferromagnetic material is exchange coupled with the pinned layer at a second side of the pinned layer that is opposite the first side.

* * * * *